United States Patent
Kang et al.

(10) Patent No.: US 10,355,066 B2
(45) Date of Patent: Jul. 16, 2019

(54) DISPLAY DEVICE

(71) Applicant: LG Display Co., Ltd., Seoul (KR)

(72) Inventors: Kyungyun Kang, Jinju-si (KR); Jaewoong Youn, Incheon (KR); Kihyung Lee, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/831,886

(22) Filed: Dec. 5, 2017

(65) Prior Publication Data

US 2018/0175130 A1 Jun. 21, 2018

(30) Foreign Application Priority Data

Dec. 15, 2016 (KR) ........................ 10-2016-0171881

(51) Int. Cl.
*H01L 21/00* (2006.01)
*H01L 29/06* (2006.01)
*H01L 27/32* (2006.01)
*H01L 51/52* (2006.01)

(52) U.S. Cl.
CPC ...... *H01L 27/3272* (2013.01); *H01L 27/3246* (2013.01); *H01L 27/3258* (2013.01); *H01L 27/3283* (2013.01); *H01L 27/3286* (2013.01); *H01L 51/5246* (2013.01)

(58) Field of Classification Search
CPC .................................................. H01L 27/3272
USPC .................................. 438/25, 31; 257/81, 99
See application file for complete search history.

(56) References Cited

U.S. PATENT DOCUMENTS

| 8,350,987 | B2* | 1/2013 | Yang | G02F 1/1343 349/64 |
| 9,366,802 | B2* | 6/2016 | Lee | H05K 5/02 349/58 |
| 9,470,921 | B2* | 10/2016 | Son | G02F 1/133308 |
| 9,488,772 | B2* | 11/2016 | Momose | G02F 1/133308 |
| 2017/0131605 | A1* | 5/2017 | Kwak | G02F 1/133345 |

* cited by examiner

*Primary Examiner* — Calvin Lee
(74) *Attorney, Agent, or Firm* — Morgan, Lewis & Bockius LLP

(57) ABSTRACT

The present disclosure is provided a display device including a lower substrate, a display area, and a guideline. The display area is disposed on the lower substrate. The guideline includes a guideline disposed in an outer region of the display area. The guideline includes: a first guideline layer disposed on the lower substrate, having separation spaces, and divided into multiple parts; and a second guideline layer disposed on the first guideline layer and divided into multiple parts.

13 Claims, 13 Drawing Sheets

DISPLAY DEVICE

This application claims the benefit of Korean Patent Application No. No. 10-2016-0171881, filed on Dec. 15, 2016, the entire contents of which is incorporated herein by reference for all purposes as if fully set forth herein.

BACKGROUND

Technical Field

The present disclosure relates to a display device.

Discussion of the Related Art

With the development of information technologies, there are increasing demands for a display device which is a medium enabling a user to access information. Accordingly, display devices, such as an Light Emitting Display (LED), a Liquid Crystal Display (LCD), and a Plasma Display Panel (PDP), have become used more widely.

Some of the aforementioned display devices, such as the LCD or the LED, includes a display panel which includes a plurality of subpixels and a driving unit for driving the display panel. The driving unit includes a scan driver for supplying a scan signal (or a gate signal) to the display panel, and a data driver for supplying a data signal to the display panel.

Such display devices operate such that, when the scan signal or the data signal is supplied to subpixels arranged in matrix, a selected subpixel emits light so that an image is displayed.

A display panel includes subpixels and thin film structures such as signal lines and power lines. Such thin film structures are susceptible to outdoor air, such as moisture and oxygen. For this reason, a display panel is made such that sealant is formed in an outer region of a lower substrate and that the lower substrate and an upper substrate are bonded and sealed so as to protect thin film structures formed on the lower substrate. However, the existing sealing structure and method has problems that a moisture permeation path exists and it is difficult to block permeated moisture. Thus, these problems are required to be solved.

SUMMARY

Accordingly, embodiments of the present disclosure are directed to a display device that substantially obviates one or more of the problems due to limitations and disadvantages of the related art.

Features and aspects of embodiments of the present disclosure will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a lower substrate, a display area, and a guideline. The display area is disposed on the lower substrate. The guideline includes a guideline disposed in an outer region of the display area. The guideline includes: a first guideline layer disposed on the lower substrate, having separation spaces, and divided into multiple parts; and a second guideline layer disposed on the first guideline layer and divided into multiple parts.

In another aspect, a display device comprises a lower substrate, a display area, a guideline, and an adhesive layer. The display area is disposed on the lower substrate. The guideline includes: an inner guideline adjacent to the display area; and an outer guideline adjacent to an edge of the lower substrate. The adhesive layer is positioned between the inner guideline and the outer guideline. Each of the inner guideline and the outer guideline includes: a first guideline layer disposed on the lower substrate, having separation spaces, and divided into multiple parts; and a second guideline layer disposed on the first guideline layer and divided into multiple parts.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Reference will now be made in detail to embodiments of the present disclosure, examples of which are illustrated in the accompanying drawings.

Hereinafter, specific embodiments of the present disclosure will be described with the accompanying drawings.

A display device according to the present disclosure may be implemented as a TV, a video player, a personal computer (PC), a home theater, a smart phone, and the like, but it is not limited thereto. In the following description, an Light Emitting Display (LED) based on an organic light emitting diode or an inorganic light emitting diode is described, but the present disclosure is not limited thereto and it can be applied to a similar display device. However, for convenience of explanation, an OLED implemented based on an organic light emitting diode will be described as an example of the present disclosure.

In addition, terms used herein, such as a signal, a line, and a device, may differ from a manufacturer to a manufacturer, and thus, functional interpretation of each term is required. In the following, a Thin Film Transistor (TFT) may be called a source electrode and a drain electrode or a drain electrode and a source electrode, except for a gate electrode. However, to avoid any limitation, the source electrode and the drain electrode are described as a first electrode and a second electrode.

Figure 1:
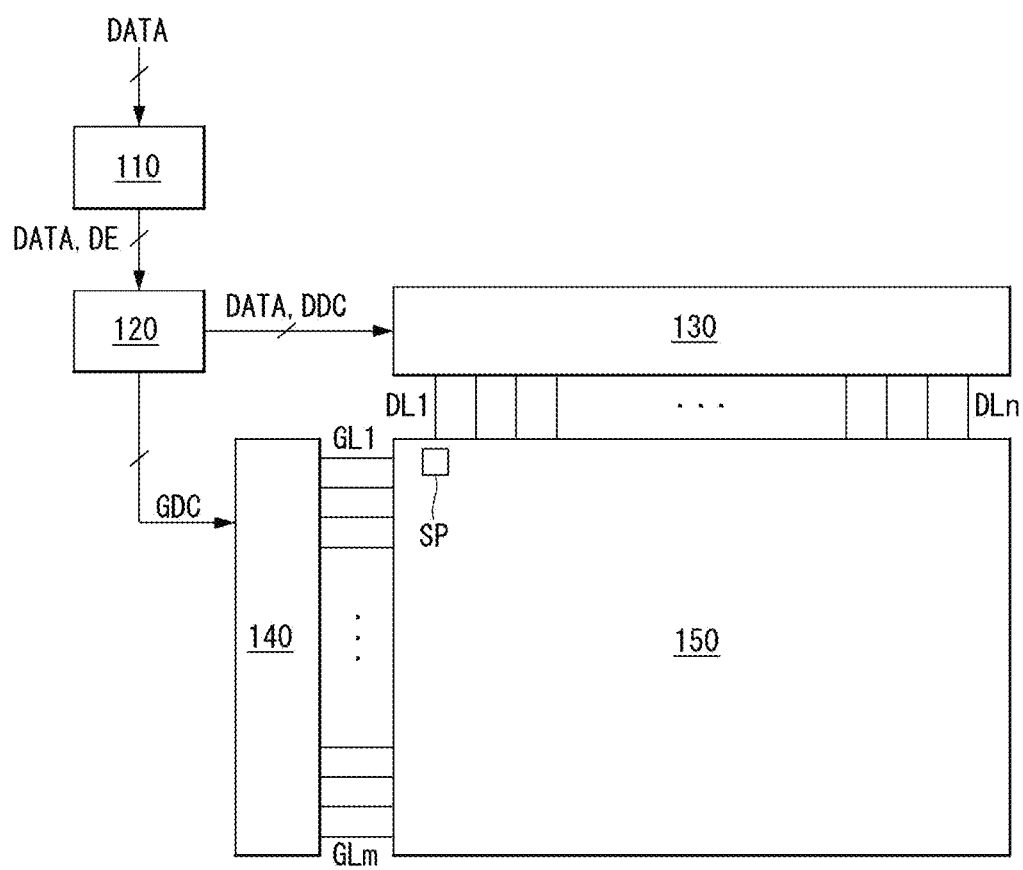
FIG. 1 is a schematic block diagram illustrating an Organic Light Emitting Display (OLED).
Figure 2:
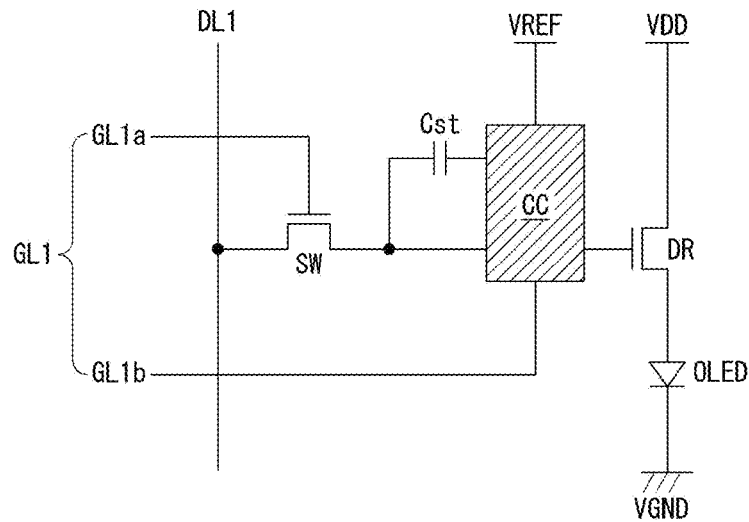
FIG. 2 is a schematic circuit diagram of a subpixel.
Figure 3:
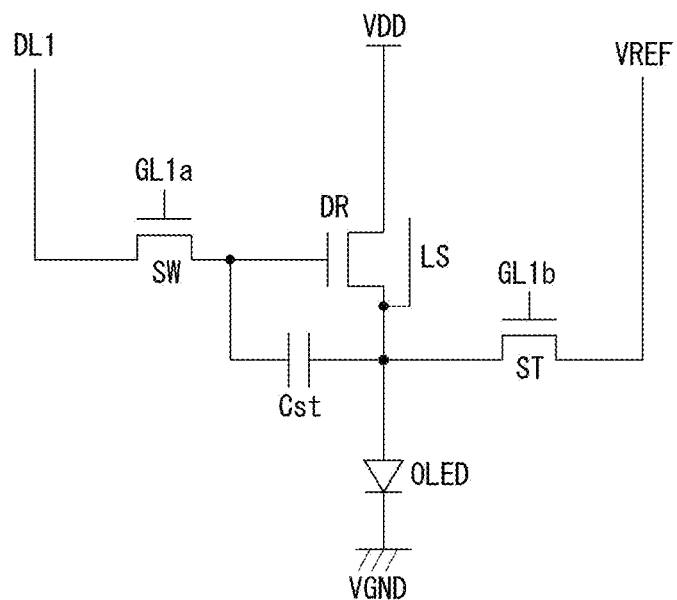
FIG. 3 is an exemplary circuit diagram of a subpixel according to an embodiment of the present disclosure.

FIG. 1 is a schematic block diagram illustrating an Organic Light Emitting Display (OLED), FIG. 2 is a schematic circuit diagram illustrating a subpixel, and FIG. 3 is an example of a circuit configuration of a subpixel according to an embodiment of the present disclosure.

As illustrated in FIG. 1, the OLED includes an image processing unit 110, a timing controller 120, a data driver 130, a gate driver 140, and a display panel 150.

The image processing unit 110 outputs a data enable signal DE in addition to a data signal DATA supplied from the outside. The image processing unit 110 may output at least one of a vertical synchronization signal, a horizontal synchronization signal, and a clock signal, in addition to the data enable signal DE, but these signals are not depicted in drawings for convenience of explanation. The image processing unit 110 is formed as an Integrated Circuit (IC) on a system circuit board.

The timing controller 120 is supplied from the image processing unit 110 with a data signal DATA in addition to a data enable signal DE and a driving signal which includes a vertical synchronization signal, a horizontal synchronization signal, and a clock signal.

Based on a driving signal, the timing controller 120 outputs a gate timing control signal GDC for controlling an operation timing of the gate driver 140, and a data timing control signal DDC for controlling an operation timing of the data driver 130. The timing controller 120 is formed as an IC on a control circuit board.

In response to a data timing control signal DDC supplied from the timing controller 120, the data driver 130 may samples and latches a data signal DATA from the timing controller 120, converts the data signal DATA into a gamma reference voltage, and outputs the gamma reference voltage. The data driver 130 outputs the data signal DATA through data lines DL1 to DLn. The data driver 130 is formed as an IC on a data circuit board.

In response to a timing control signal GDC supplied from the timing controller 120, the gate driver 140 outputs a gate signal. The gate driver 140 outputs a gate signal through gate lines GL1 to GLm. The gate driver 140 is formed as an IC on a gate circuit board or is formed on the display panel 150 by a Gate In Panel method.

In response to a data signal DATA from the data driver 130 and a gate signal from the gate driver 140, the display panel 150 displays an image. The display panel 150 includes subpixels SP that displays an image.

A subpixel is configured as a top emission type, a bottom emission type, or a dual emission type depending on its structure. The subpixels SP may include red subpixels, green subpixels, and blue subpixels, or may include white subpixels, red subpixels, green subpixels, and blue subpixels. The subpixels SP may have one or more emission areas depending on their emission characteristics.

As shown in FIG. 2, each subpixel SP includes a switching transistor SW, a driving transistor DR, a capacitor Cst, a compensation circuit CC, and an organic light emitting diode OLED. The organic light emitting diode OLED operates to emit light depending on a driving current formed by the driving transistor DR.

In response to a gate signal received through a 1-a gate line GL1a, the switching transistor SW performs a switching operation so that a data signal received through a first data line DL1 is stored in the capacitor Cst as a data voltage. The driving transistor DR operates so that the driving current flows between a high-potential power line VDD and a low-potential power line GND depending on the data voltage stored in the capacitor Cst.

The compensation circuit CC is a circuit for compensating for a threshold voltage of the driving transistor DR. The compensation circuit CC includes at least one transistor and at least one capacitor. The compensation circuit CC may have various configurations depending on a compensation method, and one example thereof will be described in the following.

As illustrated in FIG. 3, the compensation circuit includes a sensing transistor ST and a reference line VREF. The sensing transistor ST is connected between a source line of the driving transistor DR and an anode electrode of the organic light emitting diode OLED (hereinafter, referred to as a sensing node). The sensing transistor ST operates so that an initialization voltage received through the reference line VREF is supplied to the sensing node or that a voltage or current of the sensing node is sensed.

The switching transistor SW includes a gate electrode connected to the 1-a gate line GL1a, a first electrode connected to a first data line DL1, and a second electrode connected to a gate electrode of the driving transistor DR. The driving transistor DR includes a gate electrode connected to a second electrode of the switching transistor SW, a first electrode connected to a first power line VDD, and a second electrode connected to the anode electrode of the organic light emitting diode OLED. The capacitor includes a first electrode connected to a gate electrode of the driving transistor DR, and a second electrode connected to the anode electrode of the organic light emitting diode OLED. The organic light emitting diode OLED includes the anode electrode connected to the second electrode of the driving transistor DR, and a cathode electrode connected to a second power line VGND. The sensing transistor ST includes a gate electrode connected to a 1-b gate line GL1b, a first electrode connected to the reference line VREF, and a second electrode connected to the second electrode of the driving transistor DR, which is a sensing node, and to the anode electrode of the organic light emitting diode OLED.

For example, an operation time of the sensing transistor ST may be similar/identical to an operation time of the switching transistor SW depending on a compensation algorithm (or configuration of the compensation circuit). The reference line VREF may be connected to the data driver. In this case, the data driver may sense a sensing node of each subpixel and generate a sensing result in real time, in a non-display time of an image, or in a period of N-th frame (N is an integer equal to or greater than 1).

In addition, a compensation target according to a sensing result may be a digital data signal, an analog data signal, or a gamma. In addition, the compensation circuit which generates a compensation signal (or a compensation voltage) based on the sensing result may be provided inside the data driver 130 and the timing controller 120, or may be implemented as an additional circuit.

A light shield layer LS may be disposed only below a channel region of the driving transistor DR, or may be disposed not just below the channel region of the driving transistor DR but also below channel regions of the switching transistor SW and the sensing transistor ST. The light shield layer LS may be used just to shield external light, and may be used as an electrode to seek for connection with a different electrode or line and to configure a capacitor or the like.

In FIG. 3, an example of a subpixel in a 3T(Transistor) 1C(Capacitor) structure which includes a switching transistor SW, a driving transistor DR, a capacitor Cst, an organic light emitting diode OLED, and a sensing transistor ST is described. However, if a compensation circuit CC is added, a subpixel may be configured in a 3T2C, 4T2C, 5T1C, or 6T2C structure.

In addition, TFTs such as the switching transistor SW, a driving transistor DR, and a sensing transistor ST may be implemented based on low-temperature polycrystalline silicon (LTPS), amorphous silicon (a-Si), an oxide, or an organic semiconductor layer.

Figure 4:
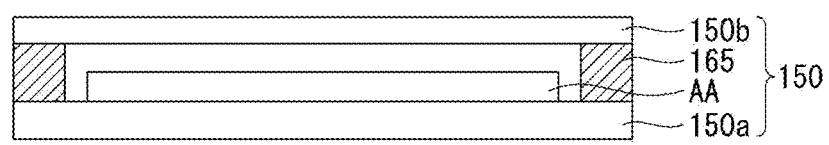
FIG. 4 is an exemplary cross-sectional view of a display panel.
Figure 5:
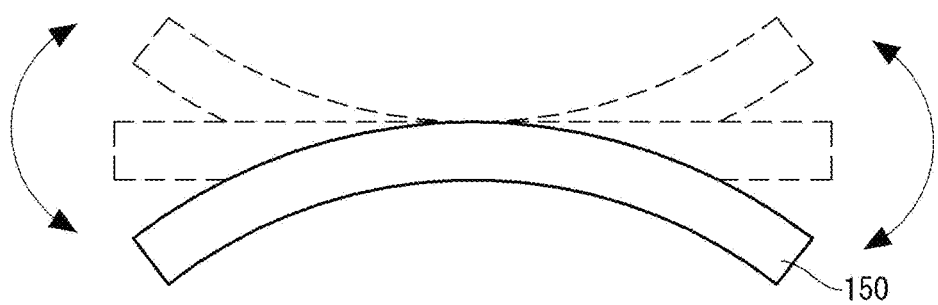
FIG. 5 is an exemplary diagram illustrating mechanical characteristics of the display panel shown in FIG. 4.
Figure 6:
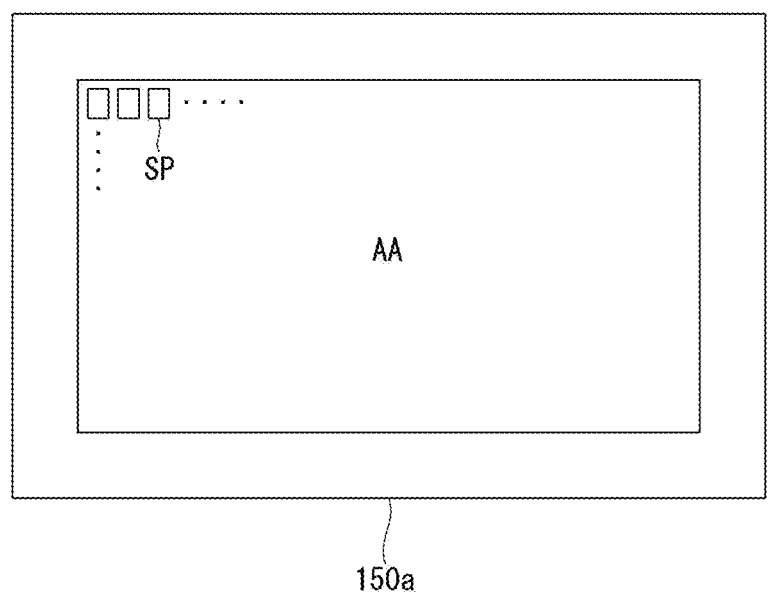
FIG. 6 is an exemplary plan view of a display panel.
Figure 7:
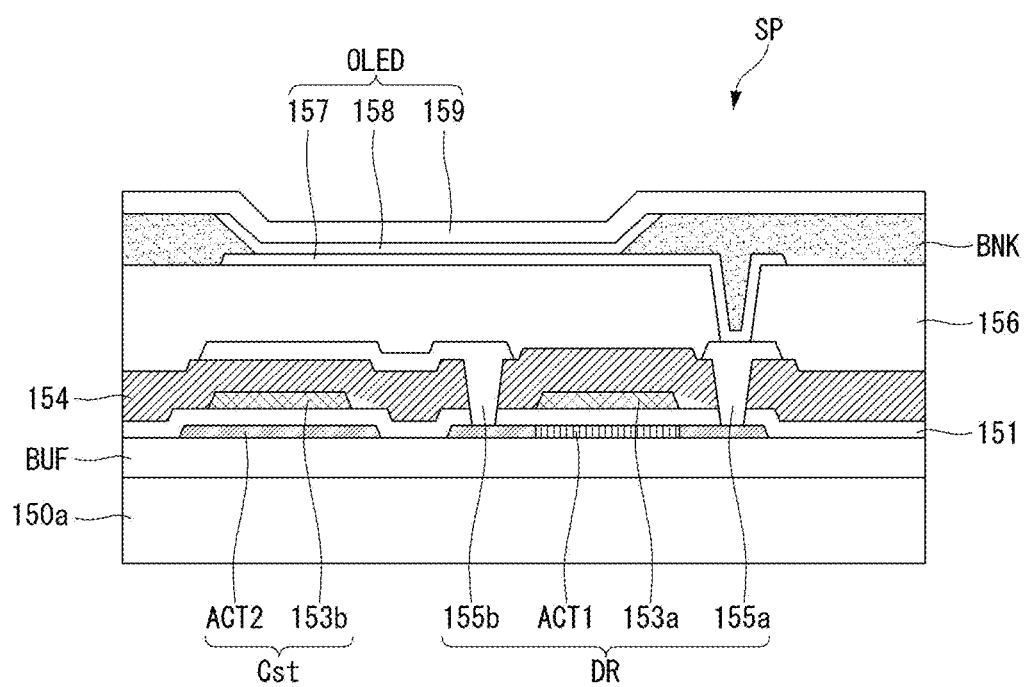
FIG. 7 is an exemplary cross-sectional view of a display panel with reference to a single subpixel.

FIG. 4 is an exemplary cross-sectional view of a display panel, FIG. 5 is a diagram illustrating mechanical characteristics of the display panel shown in FIG. 4, FIG. 6 is an exemplary plan view of a display device, and FIG. 7 is an exemplary cross-sectional view of a display panel which is shown with reference to a single subpixel.

As illustrated in FIG. 4, the display panel 150 includes a lower substrate 150a, a display area AA, an adhesive layer 165, and an upper substrate 150b. At least one of the lower substrate 150a and the upper substrate 150b is formed of glass or a plastic material which is selected from polyimide (PI), polyethersulfone (PES), polyethylene terephthalate; (PET), polycarbonates (PC), polyethylene naphthalate (PEN), and acrylonitrile butadiene styrene (ABS).

The display area AA is formed between the substrate 150a and the upper substrate 150b. On the display area AA, subpixels, various signal lines, and various power lines are formed. The subpixels, the signal lines, and the power lines disposed on the display area AA are formed by a thin film process.

Thin film structures, such as the subpixels, the signal lines, and the power lines formed on the display area AA, are susceptible to outdoor air, such as moisture (humidity) and oxygen. Thus, the lower substrate 150a and the upper substrate 150b are bonded and sealed by the adhesive layer 165 disposed therebetween. The adhesive layer 165 is formed of a adhesive material which is selected from sealant or frit. Meanwhile, the display area AA may be protected by a protective layer. The protective layer may be a single layer, multiple layers, or organic layers and inorganic layers alternatively deposited with each other.

An OLED made based on the aforementioned display panel 150 may be implemented as a top emission type, a bottom emission type, or a dual emission type. Hereinafter, the structure of a subpixel will be described in the case where the display panel 150 is implemented as a top emission type.

As illustrated in FIG. 7, a buffer layer BUF is disposed above the lower layer 150a. The buffer layer BUF may be configured as a single layer of SiNx or SiOx, or may be configured as multiple layers of SiNx and SiOx.

Semiconductor layers ACT1 and ACT2 are disposed on the buffer layer BUF. First and second semiconductor layers ACT1 and ACT2 are separated by a patterning process. The first semiconductor layer ACT1 includes a semiconductor region (including source, channel, and drain regions) of the driving transistor, and the second semiconductor layer ACT2 becomes a bottom electrode of the capacitor Cst.

A first insulation layer 151 is disposed on the semiconductor layers ACT1 and ACT2. The first insulation layer 151 may be a single layer of SiNx or SiOx, or may be multiple layers of SiNx and SiOx.

Gate metal layers 153a and 153b are disposed on the first insulation layer 151. First and second metal layers 153a and 153b are separated by a patterning process. The first gate metal layer 153 is disposed to correspond to the first semiconductor layer ACT1. The first gate metal layer 153a becomes a gate electrode of the driving transistor DR. The second gate metal layer 153b is disposed to correspond to the second semiconductor layer ACT2. The second gate metal layer 153b becomes a middle electrode of the capacitor Cst.

A second insulation layer 154 is disposed on the gate metal layers 153a and 153b. The second insulation layer 154 may be a single layer of SiNx or SiOx, or may be multiple layers of SiNx and SiOx.

Data metal layers 155a and 155b are disposed on the second insulation layer 154. First and second data metal layers 155a and 155b are separated by a patterning process. The first data metal layer 155a is connected to a drain region of the first semiconductor layer ACT1 through contact holes of the insulation layers 151 and 154. The first data metal layer 155a becomes a drain electrode of the driving transistor DR. The second data metal layer 155b is connected to a source region of the first semiconductor layer ACT1 through contact holes of the insulation layers 151 and 154. The second data metal layer 155b becomes a source electrode of the driving transistor DR. The second data metal layer 155b becomes a top electrode of the capacitor Cst.

A third insulation layer 156 is disposed on the data metal layers 155a and 155b. The third insulation layer 156 is selected as an organic material that makes a surface flat. The third insulation layer 156 may be referred to as a planarization layer. The third insulation layer 156 may be formed of polyacrylate, but it is not limited thereto.

The bottom electrode 157 is disposed on the third insulation layer 156. The bottom electrode 157 is connected to the first data metal layer 155a, which is a drain electrode of the driving transistor DR, through a contact hole of the third insulation layer 156. The bottom electrode 157 becomes an anode electrode of the organic light emitting diode OLED. The bottom electrode 157 may be formed of a transparent electrode material, such as ITO, IZO, and ITZO, but it is not limited thereto.

A bank layer BNK is disposed on the third insulation layer 156. The bank layer BNK is patterned so as to cover the bottom layer 157 and have an opening that defines an emission area of the organic light emitting diode OLED. The bank BNK is made of an organic material An organic emission layer 158 is disposed on the bottom electrode 157. The organic emission layer 158 may be formed of an organic material that emits red, green, blue, or white light. The organic emission layer 158 may further include various functional layers (an electrode trap layer, a buffer layer, etc.), in addition to a hole injection layer, a hole transfer layer, an light emitting layer, and an electron injection layer.

The top electrode 159 is disposed on the organic emission layer 158. The top electrode 159 becomes a cathode electrode of the organic light emitting diode OLED. The top electrode 159 may be formed of a non-transparent electrode material, such as Al and Ag, but it is not limited thereto.

Meanwhile, a protective layer may be disposed on the top electrode 159, but aspects of the present disclosure are not limited thereto.

Hereinafter, a sealing structure of a display panel according to an experimental example and a drawback thereof will be investigated, and embodiments of the present disclosure for solving the drawback will be described. A guideline used hereinafter indicates a pattern that provides a guide line for evenly applying an adhesive layer when coating the adhesive layer and bonding lower and upper substrates. The guideline is provided as a thin film on the bottom substrate, has specific height and width, and in the form of a dam or partition.

<Experimental Example>

Figure 8:
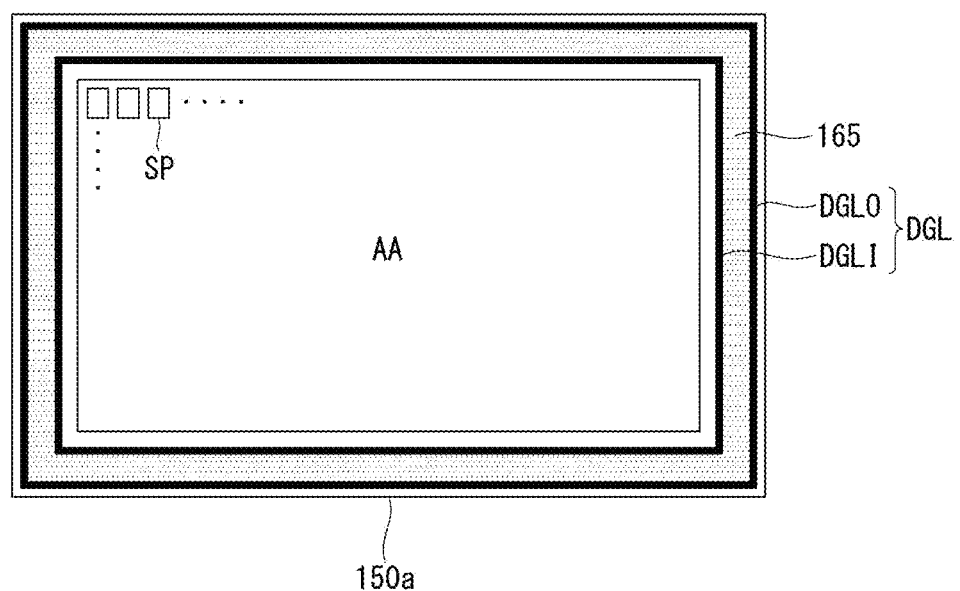
FIG. 8 is a plan view for explanation of a sealing structure of a display panel according to an experimental example.
Figure 9:
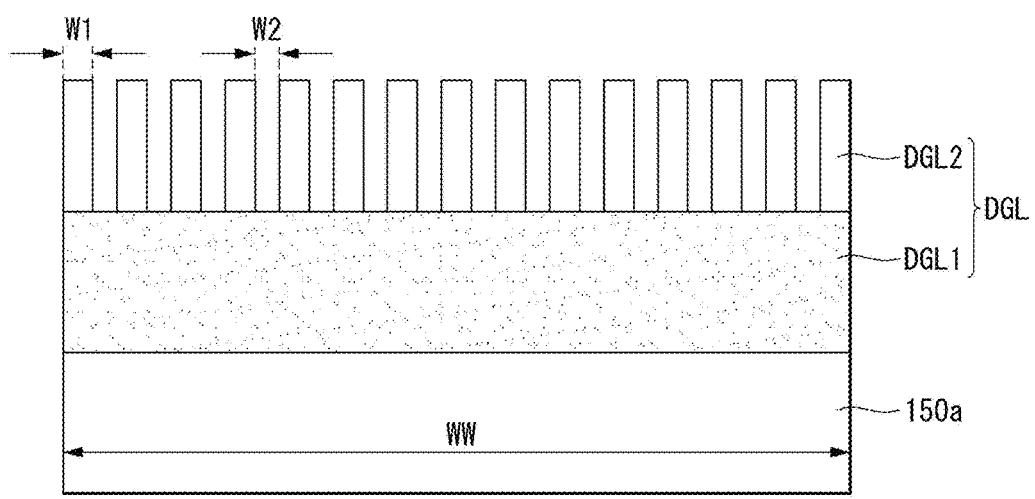
FIG. 9 is a cross-sectional view of a guideline implemented in the experimental example.

FIG. 8 is a plan view illustrating a sealing structure of a display panel according to an experimental example, and FIG. 9 is a cross-sectional view of a guideline implemented in the experimental example.

As illustrated in FIG. 8, a guideline DGL surrounding the display area AA is formed in an outer region of the lower substrate 150a. The guideline DGL includes an inner guideline DGLI and an outer guideline DGLO. An adhesive layer 165 is formed between the inner guideline DGLI and the outer guideline DGLO.

The inner guideline DGLI is disposed to surround the display area AA. Thus, the inner guideline DGLI is disposed adjacent to the display area AA. The outer guideline DGLO is disposed to surround the inner guideline DGLI. Thus, the outer guideline DGLO is disposed adjacent to the inner guideline DGLI or the edges of the lower substrate 150a.

As illustrated in FIG. 9, the guideline DGL includes a first guideline layer DGL1 and a second guideline layer DGL2. The first guideline layer DGL1 is formed on the lower substrate 150a, and the second guideline layer DGL2 is formed on the first guideline layer DGL1. The first guideline layer DGL1 has a rectangle or bar shape with a long horizontal length. The second guideline layer DGL2 has a rectangular shape with a long vertical length, and is divided into multiple parts.

The first guideline layer DGL1 and the second guideline layer DLG2 are formed of an organic material. The first guideline layer DGL1 is formed on a lower layer, and thus, it may be a planarization layer due to process characteristics. The second guideline layer DGL2 is formed on an upper layer, and thus, it may be a bank layer due to process characteristics.

The first guideline layer DGL1 has a wide line width ww. However, the second guideline layer DGL2 has a narrower line width w1 than the first guideline layer DGL1, because the second guideline layer DGL2 is divided into multiple parts. The second guideline layer DGL2 is divided into multiple parts so as to have the narrow line width w1 and a predetermined separation width w2.

It is desirable that the line width w1, which determines a width of the second guideline layer DGL2, is identical to the line width w2, which determines a separation distance between parts of the second guideline layer DGL2. If the two line widths w1 and w2 are identical, the second guideline layer DGL2 may be made with a uniform shape and this may help achieve easy design and process. However, the line widths w1 and w2 are determined depending on the line width ww of the first guideline layer DGL1, and thus, the line widths w1 and w2 may be different.

In the experimental example, the guideline DGL and the adhesive layer 165 shown in FIGS. 8 and 9 are used to bond and seal the lower substrate 150a and an upper substrate (not shown). The guideline DGL protects the adhesive layer 165 from flowing over in a direction to the display area AA or the outer region of the lower substrate 150a. In addition, together with the adhesive layer 165, the guideline DGL blocks (or delays) permeation of moisture (humidity) or oxygen into the display area AA That is, the guideline DGL acts as a multi-purpose barrier.

However, according to a reliability test of a display panel having the guideline DGL according to the experimental example, it is found that permeation of outdoor air is not prevented as much as expected. Based on sealing structure using the guideline DGL and the adhesive layer 165, the experimental example is able to increase adhesive strength and prevent overflow of the adhesive layer 165 and permeation of outdoor air, but the result is not satisfied enough.

After various experiments were conducted to find out a reason for the unsatisfied result, it is found that it is because the first guideline layer DGL1 of the guideline DGL provides a path which allows permeated moisture to move toward the inner region. Hereinafter, there is provided description about embodiments which may solve the problem of the experimental example.

<First Embodiment>

Figure 10:
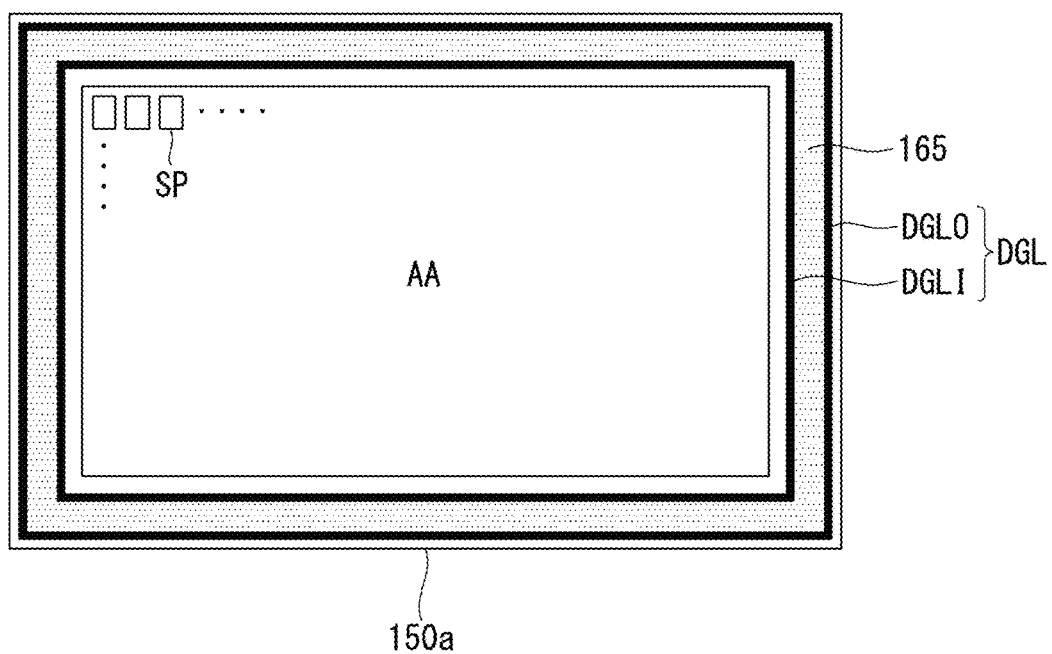
FIG. 10 is a plan view for explanation of a sealing structure of a display panel according to a first embodiment.
Figure 11:
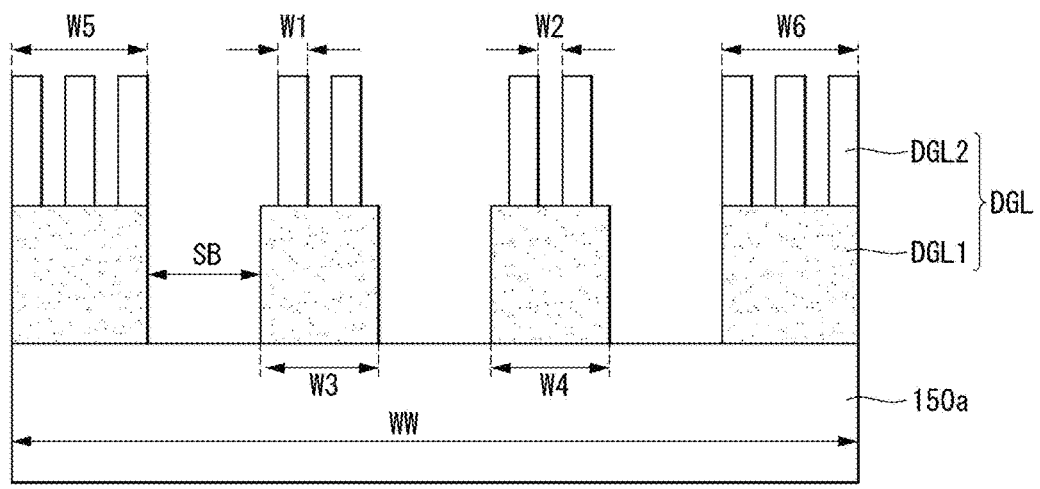
FIG. 11 is a cross-sectional view of a guideline implemented in the first embodiment.
Figure 12:
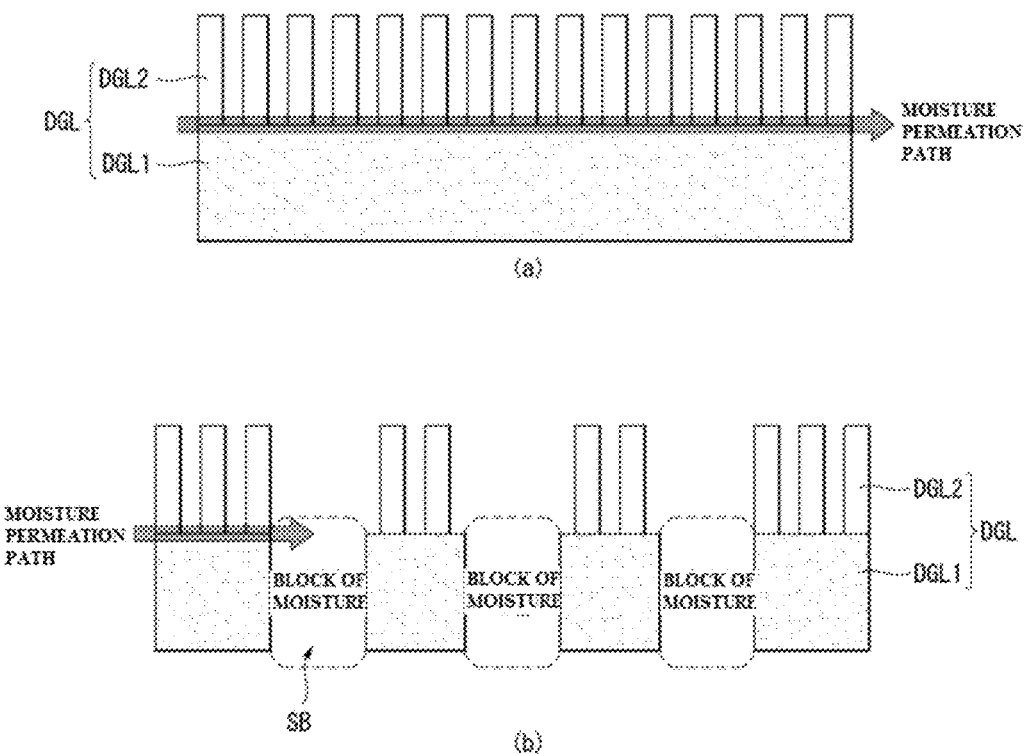
FIGS. 12 and 13 are diagrams for explanation of a difference between the experimental example and the first embodiment.
Figure 13:
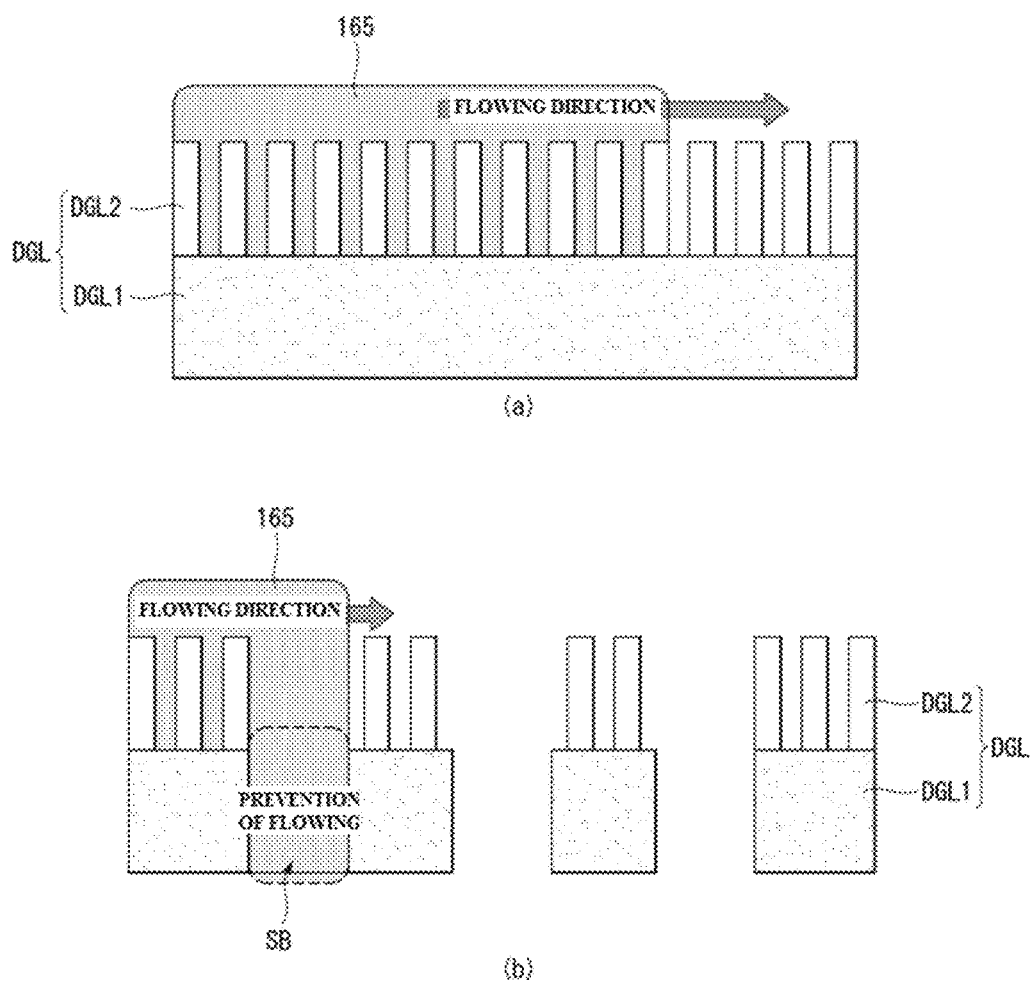

FIG. 10 is a plan view illustrating a sealing structure of a display panel according to a first embodiment of the present disclosure, FIG. 11 is a cross-sectional view of a guideline implemented in the first embodiment, and FIGS. 12 and 13 are diagrams illustrating a difference between the experimental example and the first embodiment.

As illustrated in FIG. 10, a guideline DGL surrounding a display area AA is formed on the outer region of a lower substrate 150a. The guideline DGL may be in the shape of a rectangle or a closed curve to efficiently prevent permeation of outdoor air. However, if an adhesive layer 165 is in the shape of a closed curve, the guideline DGL may be in the form of straight lines on four surfaces, except for edges. The guideline DGL includes an inner guideline DGLI and an outer guideline DGLO. The adhesive layer 165 is formed between the inner guideline DGLI and the outer guideline DGLO.

The inner guideline DLGI is formed to surround the display area AA. Thus, the inner guideline DGLI is disposed adjacent to the display area AA. The outer guideline DGLO is disposed to surround the inner guideline DGLI. Thus, the outer guideline DGLO is disposed to adjacent to the inner guideline DLGI or the edge of a lower substrate 150a.

As illustrated in FIG. 11, the guideline DGL includes a first guideline layer DGL1 and a second guideline layer DGL2. The first guideline layer DGLI is formed on the lower substrate 150a, and the second guideline layer DGL2 is formed on the first guideline layer DGL1. The first guideline layer DGL1 has a horizontal length longer than a vertical length, has a rectangular or bar shape, and is divided into multiple parts. The second guideline layer DGL2 has a vertical length longer than a horizontal length, has a prism shape (such as a quadrangular prism and a circular cylinder), and is divided into multiple parts.

The first guideline layer DGL1 and the second guideline layer DGL2 are formed of an organic material. The first guideline layer DGL1 is formed on a lower layer, and thus, it may be selected as a planarization layer due to process characteristics. The second guideline layer DGL2 is formed on an upper layer, and thus, it may be selected as a bank layer due to process characteristics. However, these are exemplary, and a material for the first guideline layer DGL1 and the second guideline layer DGL2 is not limited thereto and may be an inorganic material or an organic and inorganic mixed material. That is, one of the first guideline layer DGL1 and the second guideline layer DGL2 may be formed of a different material.

The first guideline layer DGL1 in the first embodiment occupies the same line width ww as that of the first guideline layer DGL1 in the experimental example. Although the first guideline layer DGL1 in the first embodiment has a line width ww similar/identical to a line width of the first guideline layer DGL1 in the experimental example, the first guideline layer DGL1 is divided into multiple parts so as to have separation spaces SB with a width wider than the separation width w2 of the second guideline layer DGL2 in the experimental example. Similarly to the experimental example, the second guideline layer DGL2 has a narrow width w1 and is divided into multiple parts to have a predetermined separation width w2.

As the first guideline layer DGL1 in the first embodiment has the separation spaces SB, line widths w3 to w6 of the first guideline layer DGL1 differ depending on a test result about reliability (a degree of moisture permeation). In addition, the line widths w3 to w6 of the first guideline layer DGL1 differ depending on a distance of each separation space SB positioned between the line widths w3 to w6 and the number of the separation spaces SB. For example, the line width w5 and w6 of the first guideline layer DGL1 disposed in the outer region may be wider or narrower than the line widths w3 and w4 of the first guideline layer DGL1 disposed in the inner region. In another example, the line widths w5 and w6 of the first guideline layer DGL1 disposed in the outer region may be identical to the line widths w3 and w4 of the first guideline layer DGL1 disposed in the inner region.

To bond and seal the lower substrate 150a and the upper substrate (not shown), the first embodiment utilizes the guideline DGL and the adhesive layer 165 shown in FIGS. 10 and 11. The guideline DGL prevents the adhesive layer 165 from flowing over in a direction to the display area AA or the outer region of the lower substrate 150a. In addition, together with the adhesive layer 165, the guideline DGL blocks (or delays) permeation of moisture (humidity) or oxygen into the display area AA. That is, the guideline DGL acts as a multi-purpose barrier.

A guideline DGL according to an experimental example of portion (a) in FIG. 12 has a first guideline layer DGL1 in the shape of a rectangle or bar with a long horizontal length. According to a result of a reliability test, the first guideline layer DGL1 according to the experimental example allows permeated moisture to move into the inner region. It is because the first guideline layer DGL1 according to the experimental example provides a path which allows permeated moisture to move.

The guideline DGL according to the first embodiment of portion (b) in FIG. 12 has the first guideline layer DGL1 having a rectangular or bar shape with a long horizontal width, having separation spaces SB, and divided into multiple parts. According to a result of a reliability test, the first guideline layer DLG1 in the first embodiment prevents (or delays) a permeation path so that permeated moisture is not allowed to move toward the inner region. It is because the first guideline layer DGL1 according to the first embodiment has the separation spaces SB that block permeated moisture.

Specifically, moisture permeated from the outside comes inside along an interface of a first guideline layer DGL1 which is positioned most outer. However, a moving path is blocked due to the presence of the separation spaces SB, and therefore, the moisture cannot easily move to a first guideline layer DGP1 in a next position. Thus, each separation spaces SB provides a space which permeated moisture fills for a predetermined period of time so that movement of the moisture into a next position is blocked or delayed.

A guideline DGL according to the experimental example of FIG. 13(a) has a second guideline layer DGL2 having a rectangular prism shape with a long vertical length and divided into multiple parts. The second guideline layer DGL2 prevents overflow caused by excessive discharge of the adhesive layer 165. The adhesive layer 165 covers either or both of an inner guideline and an outer guideline. In addition, the adhesive layer 165 is filled between the first guideline layer DGL1 and the second guideline layer DGL2.

According to a result of an experiment about excessive discharge of an adhesive layer, it is found that the experimental example is not enough to accommodate the excessive discharge of the adhesive layer. It is because only the spaces formed in the second guideline layer DGL2 are available to use.

The guideline DGL according to the first embodiment of FIG. 14(b) includes: a second guideline layer DGL2 having a rectangular prism shape with a long vertical length and divided into multiple parts; and a first guideline layer DGL1 having separation spaces SB. The first guideline layer DGL1 having the separation spaces SB, and the second guideline layer DGL2 prevent overflow caused by the excessive discharge of the adhesive layer 165.

According to a result of an experiment about excessive discharge of the adhesive layer, the first embodiment is enough to accommodate all of the excessive discharge of the adhesive layer 165. It is because not just spaces formed in the second guideline layer DGL2 but the separation spaces SB formed in the first guideline layer DGL1 are available to use.

Hereinafter, another embodiment having similar or identical effects as the first embodiment will be described. However, differences compared with the first embodiment will be mainly described to avoid redundant explanation.

<Second Embodiment>

Figure 14:
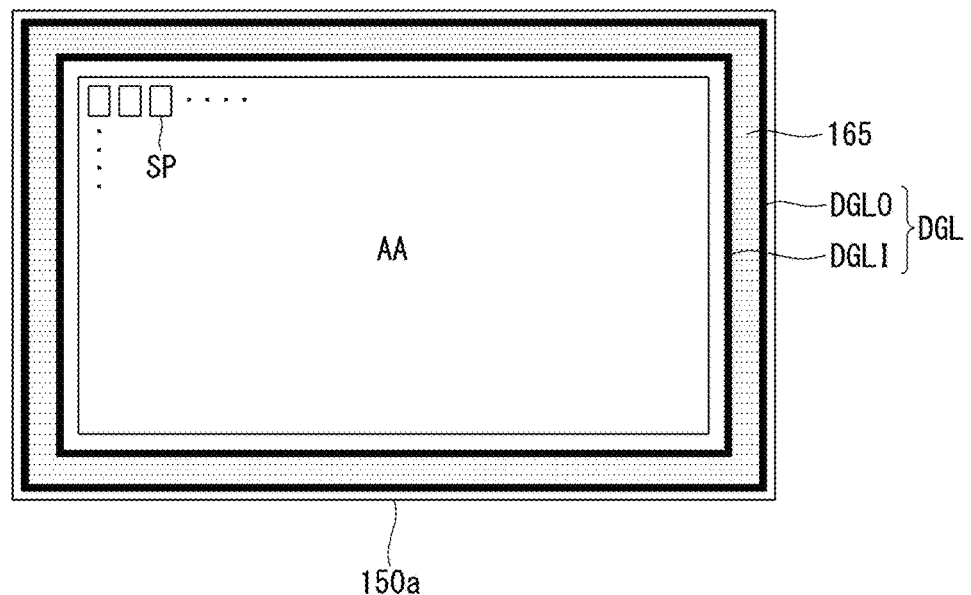
FIG. 14 is a plan view for explanation of a sealing structure of a display panel according to a second embodiment.
Figure 15:
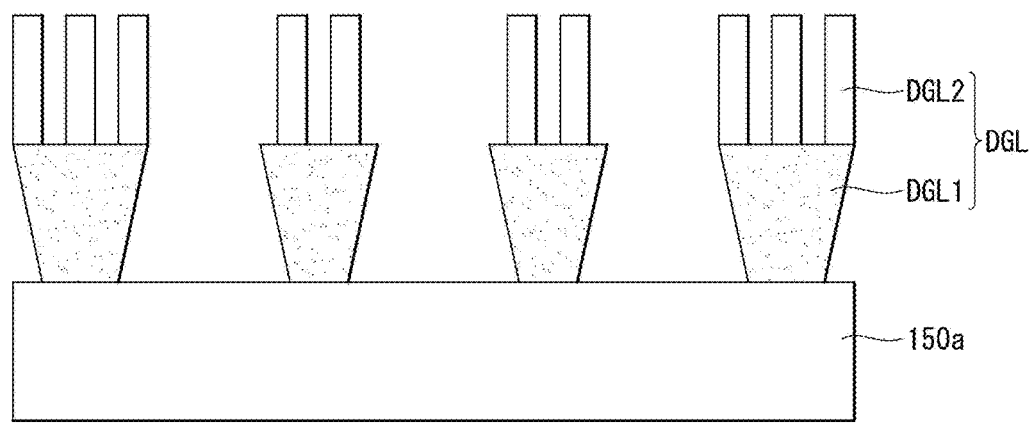
FIGS. 15 to 17 are cross-sectional views of a guideline implemented in the second embodiment.
Figure 16:
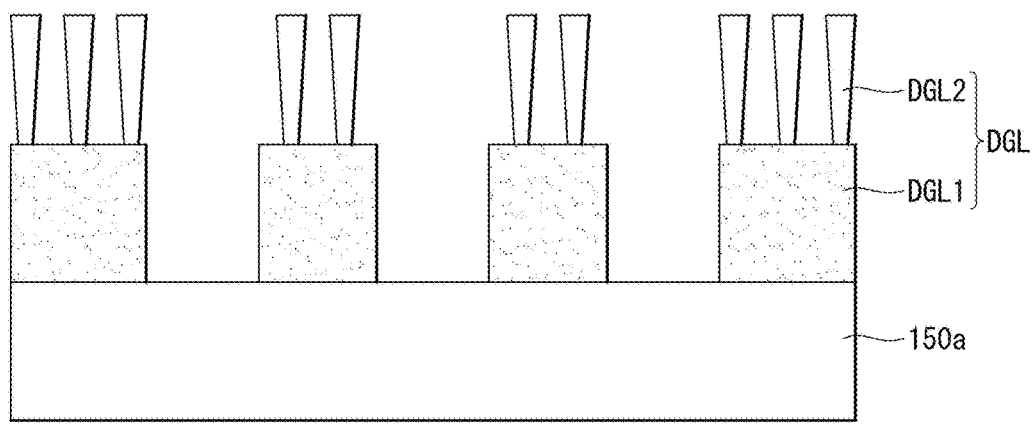
Figure 17:
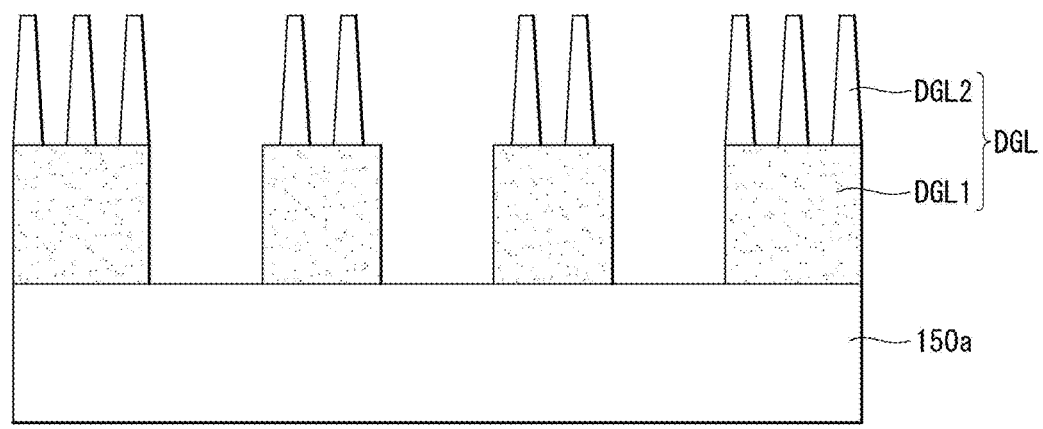

FIG. 14 is a plane view illustrating a sealing structure of a display panel according to a second embodiment of the present disclosure, and FIGS. 15 to 17 are cross-sectional views of a guideline implemented in the second embodiment.

As illustrated in FIGS. 14 to 16, a guideline DGL includes a first guideline layer DGL1 and a second guideline layer DGL2. The first guideline layer DGL1 is formed on a lower substrate 150a, and the second guideline layer DGL2 is formed on the first guideline layer DGL1. The first guideline layer DGL1 has a horizontal length longer than a vertical length, has a trapezoidal shape or a reverse-trapezoidal shape (whose upper area is larger than its lower area), and is divided into multiple parts. The second guideline layer DGL2 has a vertical length longer than a horizontal length, has a rectangular, trapezoidal, or reverse-trapezoidal prism shape, and is divided into multiple parts. The structure of the guideline DGL may be formed by appropriately combining the shapes shown in FIGS. 15 to 17.

The guideline DGL according to the second embodiment includes the first guideline layer DGL1 having a trapezoidal shape or a reverse-trapezoidal shape with a long horizontal length, having separation spaces, and divided into multiple parts. In addition, the guideline DGL according to the second embodiment includes: first guideline layer DGL1 having separation spaces SB; and a second guideline layer DGL2 having a trapezoidal prism shape or a reverse-trapezoidal prism shape with a long vertical length and divided into multiple parts.

Due to such a structure, the second embodiment may provide a wider spaces than the first embodiment. Thus, the second embodiment may achieve effects more improved than the first embodiment due to a space, which allows permeated moisture to fill therein for a predetermined period of time, and an increased space which is able to accommodate excessive discharge of the adhesive layer 165.

Meanwhile, the aforementioned guideline DGL is formed in a manner in which a structure is deposited and then etched and patterned. The guideline DGL may differ depending on a material, an etching method, and an etch selectivity. Thus, the shape of the guideline DGL is not limited to the first and second embodiments, and may be presented in a different way.

As such, the present disclosure may improve a lifespan of a display panel using a sealing structure which blocks (or delay) permeation of outdoor air, such as moisture (humidity) and oxygen, into a display area, and which prevents overflow of an adhesive layer. In addition, the present disclosure may improve a production yield of display panels and process reliability by using a structure that acts as a multi-purpose barrier.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a lower substrate;
   a display area on the lower substrate; and
   a plurality of guidelines in an outer region of the display area,
   wherein each guideline comprises:
      a first guideline layer on the lower substrate, having separation spaces, and divided into multiple noncontiguous parts, and
      a second guideline layer on the first guideline layer and divided into multiple noncontiguous parts, and
   wherein the plurality of guidelines comprises:
      an inner guideline adjacent to the display area, and
      an outer guideline adjacent to an edge of the lower substrate.

2. The display device of claim 1, wherein the second guideline layer has a vertical length longer than a horizontal length, and is in a shape of a rectangular prism, a circular cylinder, a trapezoid, or a reverse-trapezoid.

3. The display device of claim 1, wherein either of both of the first guideline layer and the second guideline layer are formed of an organic material, an inorganic material, or an organic-inorganic hybrid material.

4. The display device of claim 1, wherein the first guideline layer has a horizontal length longer than a vertical length, and has a rectangular, trapezoidal, or reverse-trapezoidal shape.

5. The display device of claim 1, wherein the first guideline layer includes separation spaces that expose the lower substrate.

6. The display device of claim 1, wherein each guideline has a closed curve shape surrounding the display area.

7. The display device of claim 1, further comprising an adhesive layer between the inner guideline and the outer guideline.

8. The display device of claim 7, wherein the adhesive layer covers either or both of the inner guideline and the outer guideline, and is filled in a space between the first guideline layer and the second guideline layer.

9. A display device, comprising:
   a lower substrate;
   a display area on the lower substrate;
   a guideline comprising:
      an inner guideline adjacent to the display area; and
      an outer guideline adjacent to an edge of the lower substrate; and
   an adhesive layer between the inner guideline and the outer guideline,
   wherein each of the inner guideline and the outer guideline comprises:
      a first guideline layer on the lower substrate, having separation spaces, and divided into multiple noncontiguous parts, and
      a second guideline layer on the first guideline layer and divided into multiple noncontiguous parts.

10. The display device of claim 9, wherein the adhesive layer covers either or both of the inner guideline and the outer guideline, and is filled in a space between the first guideline layer and the second guideline layer.

11. The display device of claim 9, wherein the first guideline layer and the second guideline layer in each of the inner guideline and the outer guideline have different structures.

12. The display device of claim 9, wherein each of the inner guideline and the outer guideline has a closed curve shape surrounding the display area.

13. The display device of claim 9, wherein the first guideline layer and the second guideline layer have different line widths.

* * * * *